May 21, 1974 N. G. LESH ET AL 3,811,973

TECHNIQUE FOR THE FABRICATION OF A BILEVEL THIN FILM INTEGRATED CIRCUIT

Filed Aug. 11, 1972

United States Patent Office 3,811,973
Patented May 21, 1974

3,811,973

TECHNIQUE FOR THE FABRICATION OF A BI-LEVEL THIN FILM INTEGRATED CIRCUIT

Nathan George Lesh, Bethlehem, Pa., and Peter Joseph O'Day, Spring Lake, and Burton Abram Unger, Berkeley Heights, N.J., assignors to Bell Telephone Laboratories, Incorporated, Murray Hill, N.J.

Filed Aug. 11, 1972, Ser. No. 280,055
Int. Cl. C23f 1/02
U.S. Cl. 156—3 5 Claims

ABSTRACT OF THE DISCLOSURE

Bilevel thin film circuits having gold metallized through holes require protection from attack by gold conductor etchants. A novel procedure for effecting this end involves plating an etch stop such as rhodium or platinum upon the walls of the through holes and around the entrance and exit ports. Since rhodium plating is normally required in the fabrication of such circuits for solderable components, the through hole protection and rhodium plating may be performed simultaneously.

FIELD OF THE INVENTION

This invention relates to a technique for the fabrication of a bilevel thin film circuit. More particularly, the present invention relates to a technique for the fabrication of bilevel thin film circuits wherein metallized through holes are protected from attack by conductor etchants during front and back surface pattern delineation steps.

DESCRIPTION OF THE PRIOR ART

In the fabrication of bilevel thin film circuits, conductor metallization is deposited upon the front and back surfaces of a substrate member, connections between wiring on the respective surface being effected by means of metallized through holes in the substrate. The procedure employed in the fabrication of such structures typically involves depositing successive layers of an adhesion promoter, palladium and gold upon the noted surfaces and in the interior of the through holes. In the event resistors are desired, tantalum nitride may optionally be deposited as the first layer of the metallization. Thereafter, the gold layer is increased in thickness by plating techniques and a desired conductor pattern generated therein by photolithographic methods. Such methods involve coating the through holes with photoresists, either in liquid or dry polymeric form, the latter merely involving tenting of the holes to protect the metallized interior. However, in both cases it has been found that the photoresist fails to adequately protect the metallization in the holes, either due to failure to completely cover the metallization (liquid photoresist) or due to the breakdown of the dry photoresist during the processing, so permitting the etchants employed in the photolithographic process to attack the through hole metallization. Unfortunately, such attack impairs or destroys through hole circuit continuity from the front to the back side of the substrate, so prompting workers in the art to seek a suitable alternate.

SUMMARY OF THE INVENTION

In accordance with the present invention, this end is effectively attained by a novel processing sequence wherein the through holes of the bilevel structure are plated with an etch stop such as rhodium or platinum subsequent to deposition of the gold conductor. The rhodium so deposited is inert with respect to the standard etchants utilized in processing thin film circuits, thereby resulting in the formation of a protective coating for the underlying films. An additional advantage residues in the fact that most bilevel circuits require rhodium plating for solderable components and this end may be conveniently effected concurrently with through hole plating. Briefly, the inventive techniques involve metallizing the front and back surfaces of a substrate member including at least one through hole, the interior walls of the hole being coated during the metallization operation. The metallization typically comprises an adhesion promoter such as titanium, palladium and a conductive layer of gold. Optionally, tantalum nitride may be deposited prior to the titanium if resistors are desired. Following, a dry film photoresist is applied to both sides of the substrate, exposed and developed, so resulting in the generation of a window over the annuli of the through holes. Thereafter, selective plating of the holes is effected with rhodium and the photoresist removed. Gold may also be selectively plated over the rhodium when it is desired to insure solderability in areas other than via holes. Finally, the required circuit geometry is defined by conventional techniques.

BRIEF DESCRIPTION OF THE DRAWING

The invention will be more readily understood by reference to the following detailed description taken in conjunction with the accompanying drawing wherein.

DETAILED DESCRIPTION OF THE INVENTION

Figure 1:
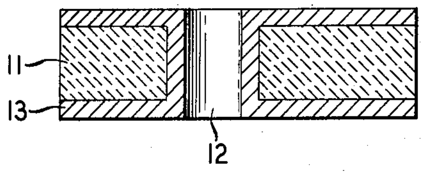
FIG. 1 is a front elevational view in cross section of a substrate member suitable for use in the practice of the present invention upon which conductor metallization has been deposited upon front and back surfaces.

With reference now to more particularly FIG. 1, there is shown a front elevational view in cross section of a typical substrate member 11, including a through hole 12, suitable for use in the practice of the present invention. The substrate chosen for use herein is insulating in nature and is preferably a high alumina ceramic.

Figure 2:
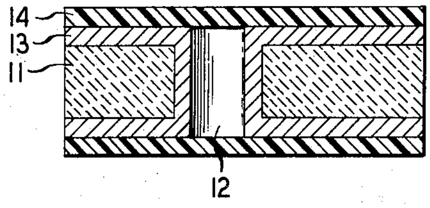
FIG. 2 is a front elevational view in cross section of the structure of FIG. 1 after the deposition thereon of a dry film photoresist.
Figure 3:
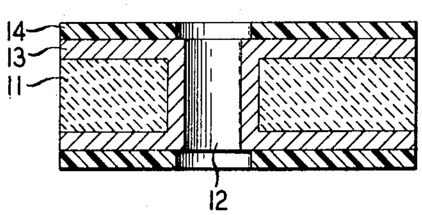
FIG. 3 is a front elevational view in cross section of the structure of FIG. 2 after generation of a window in the photoresist over the annulus of the through hole.

Initially, there is deposited upon front and back surfaces of substrate 11 conductor metallization 13, a composite typically comprising an adhesion promoter such as titanium (which may be deposited upon tantalum nitride), palladium and gold. The noble metal serves as the intermediate layer of the conductive composite and prevents metal migration down dislocation cores and through grain boundaries. During the deposition of metallization 13, the interior surfaces of the through hole 12 are also coated. Next, a dry film negative photoresist 14, shown in FIG. 2, is deposited upon metallization 13 on both front and back surfaces of the substrate. Commercially available dry film photoresists are suitable for this purpose. Next, photoresist 14 is exposed through a photomask and subsequently developed, thereby rendering the annulus of the through hole 12 and the entrance and exit ports thereof clear of resist (FIG. 3).

Figure 4:
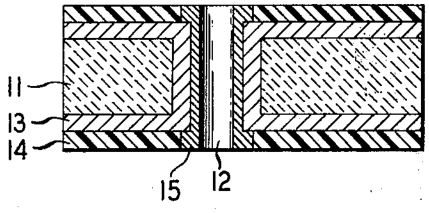
FIG. 4 is a front elevational view in cross section of the structure of FIG. 3 after successive layers of gold, rhodium and gold have been plated at the entrance and exit ports of the through hole and upon the interior walls thereof.

Following, the through hole and its entrance and exit ports are plated with a composite film comprising gold, rhodium and gold. Initially, a layer of gold is deposited upon all exposed area. This gold serves as a clear base to assure adhesion for the subsequent rhodium deposition as well as contributing to an increase in electrical conductivity of the through hole structure. The gold thickness can therefore range from 0.1 micron to 10 microns. The upper limit of 10 microns is dictated by practical considerations. Then, a film of rhodium or platinum ranging in thickness from 1.1 to 2 microns is deposited upon the gold film. The use of less than the noted minima fails to yield the required protection whereas the use of more than 2 microns fails to produce any further improvement. Lastly, another layer of gold ranging in thickness from 0.13 to 0.20 micron is deposited upon the rhodium to protect any rhodium from oxidation in those areas designed for solderable components. This gold flash may be etched from the rhodium protective deposit in the holes during subsequent etch steps without any impairment of the hole structure. The resultant structure including protective composite 15 is shown in FIG. 4.

Figure 5:
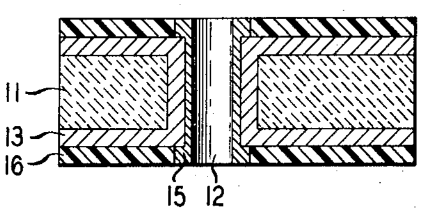
FIG. 5 is a front elevational view in cross section of the structure of FIG. 4 after removal of the dry film photoresist and substitution of a positive liquid photoresist.

The next step in the inventive process involves stripping the dry film protoresist 14 from the substrate. This may conveniently be effected with a commercial stripper available for such purpose or with acetone. Then, a second photoresist 16, a liquid resist is applied to the exposed metallization 13 (FIG. 5) and the desired circuit geometry delineated therein by first exposing resist 16 to a desired pattern and etching away the exposed portion to yield the structure shown in FIG. 6.

Figure 6:
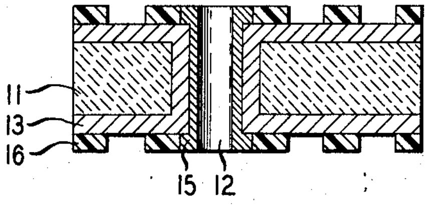
FIG. 6 is a front elevational view in cross section of the structure of FIG. 5 after the generation of a pattern in the liquid photoresist.
Figure 7:
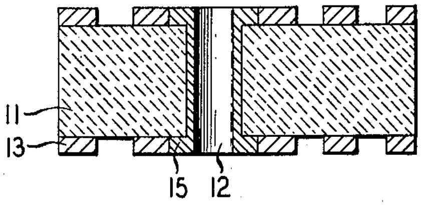
FIG. 7 is a front elevational view in cross section of the structure of FIG. 6 after etching away undesired metal and removal of the photoresist.

Finally, metallization 13 is etched away in the exposed regions of FIG. 6 and photoresist 16 removed, thereby resulting in the desired circuit, shown in FIG. 7. Components may then be attached to the resultant circuitry as desired.

What is claimed is:

1. In the process for the fabrication of bilevel thin film circuitry wherein a circuitry pattern is etched in a gold layer present on two sides of an insulating substrate sheet and also present on the wall of a through hole connecting the two sides of the sheet, the improvement which comprises depositing a layer of a metal selected from the group consisting of platinum and rhodium on the gold layer in the through hole, prior to the etching, to protect it from damage during the etching.,

2. Technique for the fabrication of a bilevel thin film circuit which comprises the steps of (a) metallizing the front and back surfaces of a substrate member including at least one through hole, said metallization covering the interior of said hole;

(b) depositing a dry film photoresist upon said surface and generating a window in said photoresist over the annulus of said hole;

(c) selectively plating the entrance and exit ports and the walls of said hole with a thin film of gold, a metal selected from the group consisting of platinum and rhodium, and gold; and (d) generating the desired pattern in the resultant structure by depositing a liquid photoresist upon exposed metallization, exposing the photoresist to a desired pattern, and etching away the exposed portion.

3. Technique in accordance with claim 2 wherein said metallization is a composite comprising titanium, palladium and gold.

4. Technique in accordance with claim 2 wherein said hole is selectively plated successively with from 0.1 to 10 microns of gold, 1.1 to 2 microns of said metal and 0.13 to 0.20 micron of gold.

5. Technique in accordance with claim 3 wherein said metallization includes a layer of tantalum nitride beneath the titanium.

References Cited

UNITED STATES PATENTS

| | | | |
|---|---|---|---|
| 3,676,087 | 7/1972 | Fefferman | 117—217 X |
| 3,634,159 | 1/1972 | Toronto | 96—36.2 X |
| 3,269,861 | 8/1966 | Schneble et al. | 117—212 |

WILLIAM A. POWER, Primary Examiner

U.S. Cl. X.R.

156—8, 13